United States Patent [19]

Tully

[11] Patent Number: 4,818,712

[45] Date of Patent: Apr. 4, 1989

[54] ALUMINUM LIFTOFF MASKING PROCESS AND PRODUCT

[75] Inventor: John W. Tully, Rolling Hills Estates, Calif.

[73] Assignee: Northrop Corporation, Hawthorne, Calif.

[21] Appl. No.: 107,626

[22] Filed: Oct. 13, 1987

[51] Int. Cl.$^4$ .................... H01L 21/88; H01L 21/306
[52] U.S. Cl. .............................. 437/26; 148/DIG. 10; 148/DIG. 56; 148/DIG. 84; 148/DIG. 100; 357/35; 357/48; 357/88; 357/91; 437/22; 437/32; 437/41; 437/74; 437/192; 437/247; 437/944; 437/987
[58] Field of Search ............... 148/DIG. 10, 11, 56, 148/65, 83, 84, 87, 100, 96; 437/22, 25, 26, 31, 32, 41, 74, 97, 917, 944, 954, 984, 987, 192, 203, 247; 357/34, 35, 43, 48, 88, 91, 92

[56] References Cited

U.S. PATENT DOCUMENTS

| 4,144,098 | 3/1979 | Roesner | 437/26 |
|---|---|---|---|
| 4,193,182 | 3/1980 | Lee | 437/26 |
| 4,222,164 | 9/1980 | Triebwasser | 437/41 |
| 4,338,139 | 7/1982 | Shinada | 437/31 |
| 4,353,935 | 10/1982 | Symersky | 437/944 |
| 4,540,446 | 9/1985 | Nonaka et al. | 148/DIG. 140 |
| 4,670,090 | 6/1987 | Sheng et al. | 456/653 |
| 4,701,349 | 10/1987 | Koyanagi et al. | 437/241 |
| 4,711,701 | 12/1987 | McLevige | 437/41 |

FOREIGN PATENT DOCUMENTS

| 0141585 | 12/1928 | Japan | 437/26 |
|---|---|---|---|
| 0033484 | 3/1977 | Japan | 437/31 |
| 0154737 | 12/1980 | Japan | 437/944 |
| 0008872 | 1/1981 | Japan | 437/26 |
| 0030345 | 2/1982 | Japan | 437/944 |
| 0004928 | 1/1983 | Japan | 437/944 |
| 0103153 | 6/1983 | Japan | 437/944 |
| 0154266 | 9/1983 | Japan | 437/31 |

OTHER PUBLICATIONS

Tully et al., "A Fully Planar Heterojunction Bipolar Transistor", IEEE, Electron Device Lett., vol. EDL-7, No. 11, Nov. 1986, pp. 615-617.

Tully, "Heterojunction Bipolar Transistors with Ion-Implanted Bases," IEEE Electron Dev. Lett., vol. EDL-7, No. 4, Apr. 1986, pp. 203-205.

Oshima et al., "A Self-Aligned GaAs/AlGaAs Heterojunction Bipolar ... " IEEE GaAs Ic Symp., 1985, pp. 53-56.

Isaac et al., "Method for Fabricating a Self-Aligned Vertical PNP Transistor", IBM TDB, vol. 22, No. 8A, Jan. 1980, pp. 3393-3396.

Primary Examiner—Brian E. Hearn
Assistant Examiner—William Bunch
Attorney, Agent, or Firm—Terry J. Anderson; Robert B. Block

[57] ABSTRACT

An aluminum liftoff masking process is effected on a prepared gallium arsenide wafer having a base thereon. Successive layers of silicon dioxide and aluminum are deposited on the wafer. The aluminum and silicon dioxide layers are successively etched, including undercutting of the aluminum layer. Base majority carriers are implanted through the windows to the base and refractory metal ohmic contacts are built up in the windows. After forming the base contacts, the base contact areas may be passivated. The aluminum layer and any overlaying layers thereon are removed by etching off the aluminum.

26 Claims, 2 Drawing Sheets

ALUMINUM LIFTOFF MASKING PROCESS AND PRODUCT

CROSS REFERENCE TO RELATED APPLICATIONS

This application is related to applications assigned to the same assignee as this invention entitled PLANAR BIPOLAR TRANSISTORS INCLUDING HETEROJUNCTION TRANSISTORS AND METHOD, Ser. No. 107,617, filed in the name of John W. Tully, Benedict B. O'Brien, William Hant and King L. Hu on Oct. 13, 1987, and REFRACTORY METAL OHMIC CONTACTS AND METHOD, Ser. No. 107,614, filed in the name of John W. Tully, on Oct. 13, 1987 both applications being filed concurrently herewith, the entire contents of which are herein incorporated by reference.

FIELD OF INVENTION

This invention is directed to a masking process which utilizes a layer of aluminum on top of a silicon dioxide layer. When the layers are patterned, the aluminum forms a liftoff structure which can withstand certain high temperature processes such as high current ion implantation and refractory metal disposition.

BACKGROUND OF THE INVENTION

Since the development of transistors and integrated circuits, there have been technology advances aimed at reducing device size, both vertically and laterally, and to increase device density and speed. In constructing a bipolar transistor having a traditional configuration, the minimum size of the emitter contact has been determined by the photolithographic limit in producing the narrowest line. This line corresponds to the width of the emitter contact.

The size of the base-collector junctions has been determined by the process ability to reregister another set of lines to define the base contacts. The minimum size of the emitter is wider than the width of the emitter contact resulting in the minimum size of the base-collector junction being greater than the width of three contact lines plus two spaces. Since the space width generally equals the line width, this results in a base-collector junction in the order of five times the width of the emitter junction.

A self-aligned emitter process which is specific to silicon technology has been used to reduce those dimensions. In this process, both the emitter and the base contacts are determined by one mask. The emitter mask opening defining the emitter size is determined by a lithography step, but the mask opening is reduced by the thickness of an oxidized layer of poly-silicon to yield a smaller opening for the emitter contact. This process is limited to silicon technology and cannot be applied to gallium arsenide or other technologies since it requires a thermal oxidation step to passivate a poly-silicon base contact from the emitter. This thermal oxidation step is not compatible with gallium arsenide technology.

SUMMARY OF THE INVENTION

In summary, ths invention is directed to a process which reduces the critical dimensions of the base-collector junction by using a layer of silicon dioxide on the semiconductor and an aluminum layer on the top of the silicon dioxide layer. These layers are patterned and a window is etched through both of them. The window is then employed in the production of semiconductor regions and contacts thereto. The aluminum layer is lifted off and a passivation layer patterned onto the contacts through the window remaining in the silicon dioxide layer. The invention is further directed to an article resulting from that process.

It is a purpose and advantage of this invention to provide a masking process which provides for self-aligning of wafer components.

It is another purpose and advantage of this invention to provide a masking process which allows high temperature processing with the mask in place and prior to its liftoff.

It is another purpose and advantage of this invention to provide an aluminum liftoff masking process which is useful in fabricating bipolar transistors and metal bridges for use in integrated circuits.

Other purposes and advantages of this invention will become apparent from the following specification, claims and attached drawings, of which:

DESCRIPTION OF THE PREFERRED EMBODIMENT

This invention is directed to a process for use in fabricating bipolar transistors including heterojunction bipolar transistors and metal bridges for use in integrated circuits. The specific disclosure is directed to the production of heterojunction bipolar transistors in a gallium arsenide substrate, but the process is suitable for a variety of substrate technologies.

Figure 1:
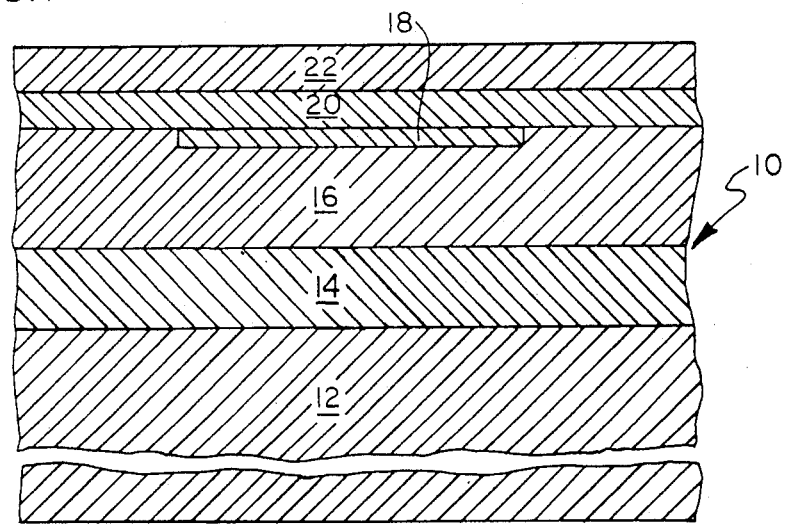
FIG. 1 is an enlarged section through a previously prepared semiconductor wafer of the type to which the process of this invention is applicable.

The disclosed process starts on a previously prepared semi-insulating semiconductor wafer 10, seen in FIG. 1. The wafer 10 has a gallium arsenide substrate 12 on which was formed an n+ subcollector layer 14 and an n collector layer 16. These layers were prepared by epitaxial growth on the substrate.

Upon completion of the collector layer 16, a base region 18 was defined by photolithography through a photoresist layer and ion implanted by selective ion implantation as, for instance, ion implanation with zinc ions. After completion of the base region by doping the collector layer 16 with an appropriate dose of an appropriate ion, the photoresist was removed and the wafer was reinserted into the epitaxial growth reactor.

In the reactor it was high temperature annealed and the emitter layer 20 and emitter contact layer 22 were epitaxially grown over the collector layer 16 and base layer 18. This completes the prepared wafer up to the structure shown in FIG. 1.

With this prepared wafer, the process is continued by first vapor-depositing a layer 24 of silicon dioxide followed by vapor-depositing thereon a layer 26 of aluminum. Each layer is on the order of 4,000 Angstroms thick. Photoresist is then applied and a base contact pattern exposed and developed into it. The base contact pattern is shaped as a square ring surrounding a central island. This island ultimately will define the emitter of the transistor.

The aluminum is then etched away in a commercial phosphoric acid etch or by reactive ion etching to form a window 28 (seen as two seperate windows in the figures since the figures are sections cutting through the true squarish ring shape of the base contact pattern).

The photoresist is then removed and the wafer transferred to a suitable reactor wherein the silicon dioxide layer 24 is RIE etched utilizing a $NF_3/Ar$ etch and the aluminum layer 26 as a mask. This $NF_3$ etch is a quasi anisotropic etch at a first lower pressure as, for example, 0.2 torr which does not cause polymerization and does not react with the aluminum layer 26 which serves as a mask for this silicon dioxide layer etch. This opens up window 30 in the silicon dioxide layer 24.

This process etches the silicon dioxide layer 24 to form the window 30 which aligns with and is an extension of the window 28 to the surface of layer 22 on the wafer.

The silicon dioxide layer 24 is then etched again using an isotropic etch also utilizing $NF_3/Ar$ at a higher pressure as, for example, 0.35 torr. This etch etches equally in all directions and is slow enough to erode under the aluminum to a specified dimension. Since this etch is very controllable and reproducible, it can be timed to achieve a controlled undercut of the aluminum mask as, for instance, a 0.2 to 0.25 micron undercut as is indicated at 32 in FIG. 2. Ultimately this undercut defines the base emitter separation allowing for a base emitter separation of 0.2 microns while utilizing 2 micron photolithography design. Because of this 0.2 micron base emitter spacing a base emitter parasitic diode can be inhibited resulting in improved performance of devices.

For the isotropic etch of the silicon dioxide layer 24 to undercut the aluminum 26, alternately either $NF_3/Ar$ or $CF_4/O_2$ can be utilized. Presently it is preferred to use the $NF_3/Ar$ etch since the etching parameters are better controlled using this etch.

Figure 2:
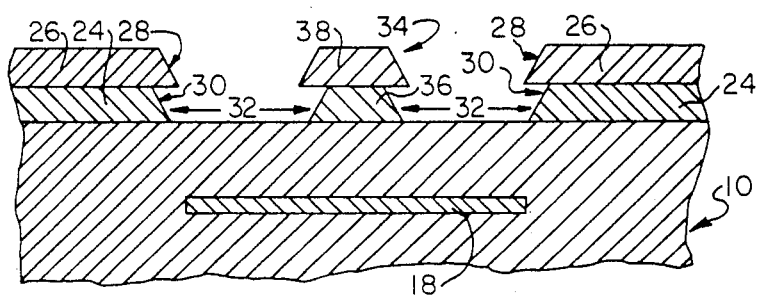
FIG. 2 is a section similar to FIG. 1, showing the application and patterning of the mask, together with implanting of the base contacts.
Figure 3:
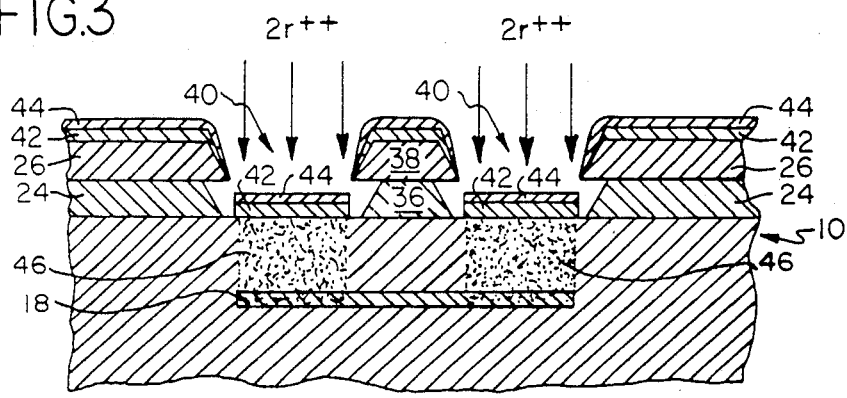
FIG. 3 is a section similar to FIG. 2 showing the base contacts in place, together with their passivating layer.

In FIG. 2, the windows 28 and 30 (hereinafter jointly referenced as window 28-30 when referring to the combined windows 28 and 30) have been opened through the aluminum layer 26 and the underlying silicon dioxide layer 24. This creates an island generally depicted by numeral 34 in the center of the squarish ring formed by the window 28-30. This island is composed of a segment of the silicon dioxide layer 24 specifically identified by the numeral 36, overlaid with a segment of the aluminum layer 26 specifically identified by the numeral 38, which overlays what will ultimately become the emitter of a transistor.

An ohmic contact (again a squarish contact shown as two separate pieces by the sectional views of the figure) 40 is now grown in the window 28-30 utilizing this window as a mask. The ohmic contact 40 is made by E-beam evaporation or other thermal evaporation of first a refractory metal such as molybdenum to form a layer 42 followed by passivation of this metal with a chromium layer 44. The chromium layer 44 serves as a passivation layer against a later $CF_4/O_2$ etch.

A further ion implantation is done through the window 28-30 to form base majority carriers in a contact layer 46 extending to the base layer 18 through the layers 22 and 20. This contact layer extends to the base layer 18 from the ohmic contact 40.

This further ion implantion is done utilizing an ion implantion such as a beryllium ion implantation which is effected through the molybdenum chromium layers 42 and 44. Alternative to a beryllium ion implantation would be a high energy zinc ion implantation. However, since the less massive beryllium ions are capable of implanting at a lower energy, beryllium ion implant formation can be done at a lower energy.

At this time the island 34 protects the material which will ultimately become the emitter. This emitter material lies below the island 34 and is protected during the ion implantation such that the emitter material retains its dopant integrity.

Alternatively to formation of the ohmic contact 40 followed by ion implantation through the ohmic contact, the implantation step can be effected first followed by the formation of the ohmic contact over it. In any event, the contact region 46 is formed between the ohmic contact 40 and the buried base layer 18. As with the window 28-30 this contact region 46 is shaped somewhat as a squarish ring.

In forming the contact 46 in addition to it serving as a contact layer to the buried base layer 18, it further serves to define the material of layer 20 which ultimately will become the emitter.

Concurrent with layering of the molybdenum layer 42 and chromium layer 44 through the window 28-30 the molybdenum and chromium are also overlayed on the top surface of the aluminum layer 26. However, because this metallization is done utilizing a thermal evaporation deposit technique, i.e. E-beam evaporation, the metallization is only effective in a straight line directly below the window 28-30 and no metallization is deposited on the undercut sides of the silicon dioxide layer 24 within the undercuts 32. While not wishing to be bound by theory, it is also believed that this directional metallization could also be achieved via sputtering.

Because the silicon dioxide layer 24 was undercut via the isotropic etch with respect to the size of the window 28 in the aluminum layer 26, and since the metallization of the molybdenum and chromium layers 42 and 44 is only directly underneath the window 30, the 0.2 micron spacing of the undercut is preserved and it will ultimately form a separation between the base and emitter which will be utilized to reduce the parasitic capacitance of base collector and base emitter.

The aluminum layer 26 is now lifted off utilizing a potassium hydroxide solution (a solution of 50 percent KOH in deionized water). This etching removes all of the aluminum layer 26. Along with lift off of the aluminum, any metallization of the molybdenum layer 42 and the chrome layer 44 deposited on the aluminum layer 26 is also removed with the aluminum.

This lift off procedure proceeds very rapidly due to the stress of the Mo/Cr layers. The ohmic contact 40 is inert to the KOH etch and it does not affect it. As the aluminum is dissolved, the Mo/Cr overlaying it is floated away from the wafer such that it does not contaminate it. This etch of the aluminum layer is sufficiently fast, occuring in about 5 to 30 minutes, that no significant etching of the gallium arsenide layers occurs.

The undercuts 32 facilitate the etch of the aluminum layer 26 since they expose metallic aluminum which is not protected by any overlaying Mo/Cr layer. The unprotected exposed undercut areas 32 allow direct attack of the etchent on the aluminum. This also contributes to the speed of this etch.

After liftoff of the aluminum layer and any metallization adhering to the top thereof the separation of the ohmic contact 40 from the silicon dioxide layer (i.e. the above referred to 0.2 micron separation) is exposed. The wafer is now sputter etched. This does two things, the first of which is to form trenches in the contact layer 22 and into the emitter layer 20 to open up an approximate 0.2 micron space between the contact region 46 and the portion of the gallium arsenide contact layer 22. This breaks an n+ gallium arsenide—p+ gallium arsenide parasitic diode formed between the layer 22 and the contact region 46. Breaking of this diode affects the recombination and gain of the device. Alternatively, ion bombardment of these areas can be suggested for breaking such a parasitic diode.

The second thing that happens with the sputter etch is cleaning of the surface by taking down some of the walls of the silicon dioxide layer 24 such that the exposed walls are taken away from a vertical to a more horizontal orientation and they end up with approximately a 45° slope. This will improve later metallization because it is much easier to lay a metallization run over these low sloping walls then higher vertical walls. This avoids thinning out and breaking of the metallization since it does not have to go over a steep wall and is laid down over a more planarized surface.

Figure 4:
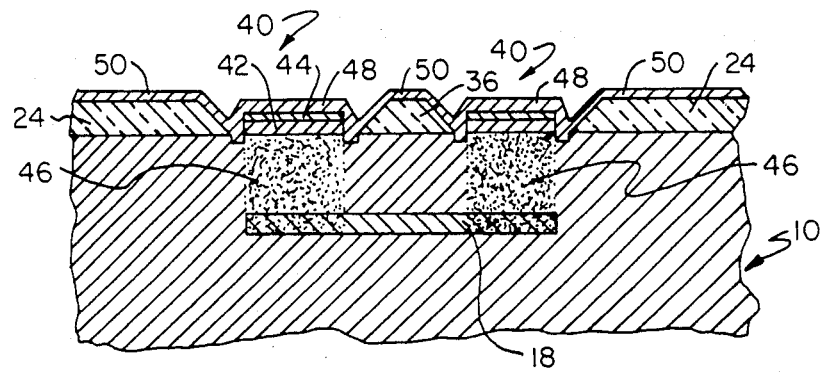
FIG. 4 is a section similar to FIG. 3 showing the removal of the aluminum layer, together with the layers thereon.

Next, as seen in FIG. 4, a silicon nitride ($Si_3N_4$) dielectric layer is sputter deposited. The silicon nitride goes down into the trenches and over the ohmic contact 40 to form caps 48 thereon. Further, at this time it also forms a cap 50 over the island 34 and the remainder of the exposed silicon dioxide layer 24. This passivates the contact 40 and forms what will utimately be a dielectric layer between the base ohmic contact and the emitter ohmic contact.

The pyramid 34 with the layer 50 thereon stands upwardly from the well created in the silicon dioxide layer 24 which houses the ohmic contact 40 with its cap layer 48 thereon. Advantage is taken of this in a further step.

After liftoff, the wafer is as shown in FIG. 4 and consists of a semiconductor 10 with the silicon dioxide layer 24 thereon. The window 30 has the base majority carriers implanted therebelow and have silicon nitride passivated refractory metal contact within the windows.

The ion-implanted base is now activated, preferably by 800° C. for 5 to 10 second rapid thermal anneal. An equivalent furnace anneal could be employed.

A resist is now laid on top of the silicon nitride passivated wafer. Suitable for this resist is PMMA resist. This resist is applied to the wafer and allowed to flow down over the cap 48. The resist is now etched in an oxygen plasma RIE etch to expose the cap 50 over the remaining portion of the island 34 (the portion 36 of the silicon dioxide layer 24) while keeping resist over the caps 48. After removal of the cap 50 utilizing a carbon tetrafluoride/oxygen plasma etch of the exposed cap 50, the portion 36 of silicon dioxide is exposed and can be etched away in BOE (buffered oxide etch).

An ohmic contact 52 to the emitter is made by patterning the contact area within the confines of the cap 48 with a chlorobenzene soaked photoresist process. Ohmic contact metal is evaporated into the window 30 to produce the emitter contact 52. After evaporating the ohmic contact metal in place, the excess metal around the contact is lifted off by removing the photoresist with acetone.

After opening a window 54 in the layer 50 a contact to the collector is made by extending this window in the silicon dioxide layer. This is effected by etching in a buffered oxide etch to produce collector window 54. The collector ohmic metal is then evaporated into the window 54 to produce the collector contact 56.

The contacts 52 and 56 are conveniently made by successive evaporation of gold germanium followed by nickel and then gold and subsequently alloying at 425° C. for 5 seconds.

Figure 5:
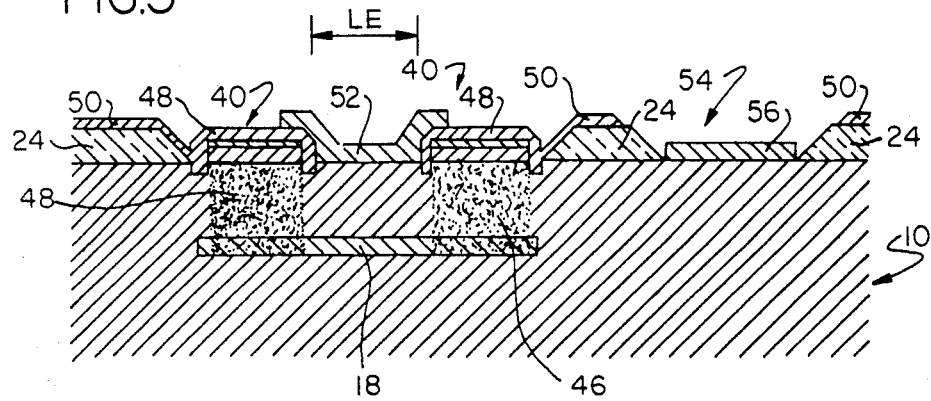
FIG. 5 is a section similar to FIG. 4 showing the positioning of the emitter and collector contacts.

FIG. 5 shows that the silicon nitride passivation of the base contact 40 reduces the width $L_E$ of the emitter contact 52 to the base contact 40 to a width which is smaller than can be achieved by photolithography. Furthermore, since the emitter contact area is defined by the silicon nitride passivation layer, the registration of the emitter contact metal 52 is not critical. The physical emitter contact is limited to the size of opening between the silicon nitride passivation of the base metal. From the configuration shown in FIG. 5, vias or paths are made through the silicon nitride passivation layer to expose the contact 40 by means of patterning the vias with photoresist followed by a brief carbon tetrafluoride/oxygen etch.

The remaining steps of device isolation and final metallization can be accomplished in a number of ways. However, as a specific example for the sake of completeness, the process for completing heterojunction bipolar transistors in gallium arsenide substrate will be followed. Following the opening of vias to the base metal contacts (or before), a structure of gold-plated islands is fabricated, one over each transistor, of sufficient thickness, e.g. 2 microns thick, to stop ion implanted hydrogen ions.

Hydrogen ions are then implanted into the gallium arsenide rendering it insulating in all areas except the transistor areas. The gold-plated islands are then removed, and the final mask is applied using a chlorobenzene-soaked photoresist liftoff process. The final metallization includes all metal runs, pads and connections to transistors.

The process also includes the benefit of easily produced bridges. This is accomplished by laying down metallization runs in conjuction with forming the ohmic contact 40 which are then covered with silicon nitride in conjuction with forming the caps 48 and 50. This, thus, leaves a silicon nitride passivation layer between points to be connected. Vias can be opened in the silicon nitride passivation layer to the points to be connected. Metalization runs can then be connected to exposed underlying metallization in the vias. This provides buried metal layer bridge for connection between transistors, voltage sources, or ground.

EXAMPLE 1

A 0.0016 inch thick semi-insulated gallium arsenide wafer polished on both sides was loaded into an MOCVD reactor (Crystal Specialties Model 410A). A gallium arsenide subcollector layer was epitaxially grown thereon to a thickness of about 0.5 microns. During growth of this layer it was doped with silicon at about $3 \times 10^{18}$ cm$^3$ to create an n+ gallium arsenide layer. A collector layer was then epitaxially grown to a thickness of about 0.6 microns. The collector layer was doped with silicon at about $1.5 \times 10^{16}$ cm$^3$ to form an n gallium arsenide collector layer. After placing a layer of photoresist on the wafer and exposing it to open up the base windows, the wafer was transferred to a commercial ion implant device and zinc ions were implanted at room temperature to a concentration of about $3 \times 10^{18}$ cm$^3$ and to a depth of about 0.12 microns. This implantation was done at 70 keV utilizing the photoresist to define the window for the base layer.

The photoresist was removed and the wafer reinserted into the MOCVD reactor. It was annealed at 920° C. for 5 minutes immediately followed by the growth of a gallium aluminum arsenide layer to a thickness of about 0.15 microns. The initial 500 Angstroms of this layer was graded in aluminum content from 0.0 to 0.30 aluminum content. This layer was also doped with silicon ions to a dopant concentration of $1 \times 10^{18}$ cm$^3$ to form an n gallium aluminum arsenide layer. Next a gallium arsenide contact layer was grown to about 0.15 microns at a silicon dopant concentration of $3 \times 10^{18}$ cm$^3$.

The wafer with the epitaxially grown layers and ion implanted areas thereon is now sputter deposited first with a layer of silicon dioxide and then a layer of aluminum each to about a thickness of 4,000 Angstroms. A base pattern is then defined with photoresist and the aluminum etched in a commercial phosphoric acid etch. The silicon dioxide is first etched with a NF$_3$/Ar etch at 0.2 torr using the aluminum mask and then an isotropic re-etch utilizing NF$_3$/Ar at 0.35 torr for a time period to achieve a controlled 0.2 micron undercut of the aluminum mask. Since this second isotropic etch is quite slow the etch is simply timed and checked by a scanning electron microscope to achieve the desired 0.2 micron undercut.

Base contact metallization is then effected utilizing a commercial E-beam evaporator. The substrate wafer was preheated in the evaporator to 140° C. for one half hour. Molybdenum was then evaporated to a thickness of about 400 Angstroms followed by evaporating a layer of chromium over the molybdenum to a thickness of about 500 Angstroms.

The wafer was then transferred back to the ion implant chamber and a beryllium ion implant effected at 35 keV at room temperature to form the base contact to the base layer doped at $3 \times 10^{19}$ cm$^3$ in the gallium arsenide layer and $2 \times 10^{19}$ cm$^3$ in the gallium aluminum arsenide layer.

The aluminum layer and extraneous molybdenum chromium located on the aluminum is then lifted off utilizing a 50% KOH/H$_2$O solution. This is completed within about 30 minutes.

The wafer was then sputter etched to form trenches adjacent to the base contact regions and to plane the remaining silicon dioxide edges to a more horizontal slope. This was followed by silicon nitride sputter deposition including filling of the trenches with silicon nitride. The beryllium ion implant was then rapidly annealed at 800° C. for 5 seconds.

A dilute PMMA layer was then spun onto the surface of the wafer to a thickness of about 2500 Angstroms and allowed to reflow in the areas over the base contacts. The PMMA layer was then RIE etched in an oxygen plasma atmosphere. A positive photoresist was applied and emitter contacts opened in it. The silicon nitride layer over emitters was then plasma etched in a CF$_4$/O$_2$ plasma followed by etching of exposed silicon dioxide in a BOE etch. Emitter metallization was completed utilizing gold germanium/nickel/gold followed by liftoff of the excess metal by soaking in acetone to lift the metal off on top of the photoresist mask. Base contacts were then annealed at 450° C. at 5 seconds in a halogen rapid thermal annealing unit (an RTA device).

A resist was laid over the wafer and collector windows opened through the resist. These windows were etched utilizing a CF$_4$/O$_2$ plasma to etch off the silicon nitride followed by a BOE etch of the exposed underlying silicon oxide. Collector contacts were then applied utilizing evaporation of gold germanium/nickel/gold and both the collector and the emitter contacts alloyed at 425° C. for 5 seconds in an RTA device.

Individual devices were then isolated by proton implantation at 100, 200 and 300 keV utilizing a 2 micron thick gold mask to protect the individual devices. Device interconnection metallization was evaported on utilizing titanium gold evaporated through an appropiate photoresist mask.

The process described above is disclosed with respect to gallium arsenide technology. It can be applied to other technologies. In silicon technology, its major benefit is to provide refractory metal contact, as opposed to poly-silicon contacts. Molybdenum (or other refractory metal) contacts to silicon would result in much lower contact resistance than is provided by poly-silicon.

Implementation of this process with silicon technology requires reactive ion etching with a gas system which would have high selectivity. A higher selectivity than carbon tetrafluoride/oxygen would be required. Possible gas systems with higher selectivity include carbon tetrafluoride/hydrogen, sulphur hexofluoride, etc. In addition, the passivation of the base metal with silicon nitride would also have to be designed to passivate any exposed silicon because of the high reactivity of potassum hydroxide and silicon. If required, complete coverage would be obtained by substituting a plasma-assisted CVD vapor deposited silicon nitride for the sputter-deposited silicon nitride utilized in the above description of the illustrative embodiment.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A process for masking a semiconductor wafer comprising the steps of:
    forming a silicon dioxide layer over a selected portion of the surface of the wafer;
    forming an aluminum layer over the silicon dioxide layer;
    defining contact areas for connection;
    etching said aluminum layer to said silicon dioxide layer in the defined contact areas to form windows in said aluminum;
    etching said silicon dioxide layer to extend said windows to the wafer surface;
    effecting one of an ion implant or an ohmic metallization followed by the other of said ion implant or ohmic metallization;
    said ohmic metallization comprising placing ohmic contact metal in said windows in contact with the implanted wafer, said ohmic metal chosen such that it is capable of withstanding subsequent temperature cycling;

said ion implant comprising ion implanting base majority carriers through said windows to implant said carriers in the semiconductor wafer;
lifting off said aluminum layer.

2. The process of claim 1 wherein:
said metallization is effected prior to said ion implant.

3. The process of claim 1 further including:
subsequent to etching said first silicon dioxide effecting a further etch of said silicon dioxide layer to undercut said aluminum layer.

4. The process of claim 2 further including:
subsequent to etching said first silicon dioxide effecting a further etch of said silicon dioxide layer to undercut said aluminum layer.

5. The process of claim 1 including:
depositing silicon nitride over said ohmic contact metal.

6. The process of claim 1 wherein:
said silicon dioxide layer is formed by vapor deposition.

7. The process of claim 1 wherein:
said aluminum layer is formed by vapor deposition.

8. The process of claim 2 wherein:
said contact area comprises a base contact area.

9. The process of claim 8 wherein:
said ion implantation of said base majority carrier through said base contact windows comprises the implantation of dopant ions to form said base majority carrier.

10. The process of claim 9 wherein:
said dopant ion is zinc.

11. The process of claim 1 wherein:
said wafer is a gallium arsenide wafer and said placement of ohmic metal in said windows comprises evaporating a refractory metal into said windows in contact with said gallium arsenide wafer.

12. The process of claim 11 further including:
evaporating a layer of chromium onto said ohmic metal to passivate said refractory metal.

13. The process of claim 12 further including:
depositing a layer of silicon nitride over said chromium layer through the windows in said silicon dioxide.

14. The process of claim 13 further including:
thermally activating said ion implanted base majority carriers;
defining an emitter contact area within said base contact area;
etching away the silicon dioxide between said base contact area and said emitter contact area to said wafer; and
depositing an emitter contact within the emitter contact area at least partially over said silicon nitride on said base ohmic contact and insulated from said base ohmic contact by said silicon nitride.

15. The process of claim 14 further including:
the steps of defining further windows through said silicon dioxide layer away from said contact window;
opening said further windows; and
depositing contact metallization in said further windows to provide contact to said wafer.

16. The process of claim 2 wherein:
said etch of said silicon dioxide to extend said windows comprises an anistropic silicon dioxide etch; and
said etch of said silicon dioxide to undercut said aluminum layer comprises an isotropic etch.

17. The process of claim 16 wherein:
said anistropic etch is effected utilizing $NF_3/Ar$ at a first low pressure; and
said isotropic etch is effected utilizing $NF_3/Ar$ at a second higher pressure.

18. The process of claim 1 wherein:
said lifting off of said aluminum layer is conducted utilizing a potassium hydroxide etch.

19. The process of claim 17 wherein:
said silicon dioxide layer is formed by vapor deposition; and
said aluminum layer is formed by vapor deposition.

20. The process of claim 16 wherein:
said lifting off of said aluminum layer is conducted utilizing a potassium hydroxide etch.

21. A masking process for gallium arsenide semiconductor wafers, comprising the steps of:
preparing a gallium arsenide wafer including a submerged base layer therein adjacent the top surface of said wafer;
forming a silicon dioxide layer over said top surface of said wafer;
forming an aluminum layer over said silicon dioxide layer;
defining on said aluminum layer a base contact area over said submerged base layer;
etching away said aluminum in said defined base contact area down to said silicon dioxide layer;
etching away said silicon dioxide layer in said defined base contact area down to said surface of said gallium arsenide wafer to define a base contact window, including etching away said silicon dioxide to define undercuts under said aluminum layer;
effecting one of a ion implant or a base contact ohmic metallization followed by the other of said ion implant or base contact ohmic metallization;
said implant ion implanting a base majority contact from said surface down to said buried base through said base contact window;
said ohmic metallization depositing base contact ohmic refractory metal in said base contact window to form base ohmic contact;
etching off said aluminum layer to expose said ohmic metallization.

22. The process of claim 21 further including:
depositing silicon nitride over said refractory metal base ohmic contacts;
thermal annealing said ion implanted base majority carrier;
defining an emitter contact area in association with said refractory metal base contact and defining a collector contact area;
opening windows at said emitter and collector contact areas to said surface of said wafer; and
depositing emitter and collector contacts respectively in said emitter and collector window so that said emitter contact is isolated by said silicon nitride covering said refractory metal base contact.

23. The proess of claim 21 wherein:
said etching off of said aluminum layer is accomplished by a potassium hydroxide etch.

24. The process of claim 21 wherein:
said etch of said silicon dioxide to define said windows comprises an anistropic silicon dioxide etch; and
said etch of said silicon dioxide to undercut said aluminum layer comprises an isotropic etch.

25. The process of claim 24 wherein:

said anistropic etch is effected utilizing NF$_3$/Ar at a first pressure; and
said isotropic etch is effected utilizing NF$_3$/Ar at a second pressure.

26. The proess of claim 24 wherein:
said etching off of said aluminum layer is accomplished by a potassium hydroxide etch.

* * * * *